United States Patent [19]
Ou

[11] Patent Number: 5,298,762
[45] Date of Patent: Mar. 29, 1994

[54] QUANTUM WELL SWITCHING DEVICE WITH STIMULATED EMISSION CAPABILITIES

[75] Inventor: Szutsun S. Ou, Manhattan Beach, Calif.

[73] Assignee: TRW Inc., Redondo Beach, Calif.

[21] Appl. No.: 982,009

[22] Filed: Sep. 28, 1992

Related U.S. Application Data

[63] Continuation of Ser. No. 755,886, Sep. 6, 1991, abandoned.

[51] Int. Cl.$^5$ .............................................. H01L 27/14
[52] U.S. Cl. .......................................... 257/13; 257/39; 257/21; 257/85; 257/919; 257/97; 359/248; 372/45; 372/46; 372/44
[58] Field of Search ..................... 257/14, 13, 39, 91, 257/113, 96, 97, 94, 85, 84, 21, 17; 372/44, 45, 46, 50, 43; 359/248, 245

[56] References Cited

U.S. PATENT DOCUMENTS

| | | | |
|---|---|---|---|
| 4,658,402 | 4/1987 | Kobayashi | 372/50 |
| 4,674,100 | 6/1987 | Kobayashi | 372/50 X |
| 4,750,183 | 6/1988 | Takahashi et al. | 372/44 X |
| 4,786,957 | 11/1988 | Muto | 257/17 |
| 4,888,783 | 12/1989 | Kojima et al. | 372/45 X |
| 4,982,408 | 1/1991 | Shimizu | 372/45 |
| 5,010,374 | 4/1991 | Cooke et al. | 357/16 |

FOREIGN PATENT DOCUMENTS 2219018 8/1990 Japan ................... 359/248

OTHER PUBLICATIONS

Treyz et al., "GaAs Multiple Quantum Well Waveguide Modulators on Silicon Substrates", *Appl. Phys. Lett.* 57(11), Sep. 10, 1990, pp. 1078–1080.

Kasahara et al., "Double Heterostructure Optoelectronic Switch as a Dynamic Memory with Low-Power Consumption," *Appl. Phys. Lett.* 52(9), Feb. 29, 1988, pp. 679–681.

G. W. Taylor, et al., "Double heterostructure optoelectronic switch as a single quantum well laser," *Applied Phys. Letters*, vol. 56, No. 14, Apr. 2, 1990, New York US pp. 1308–1310.

J. Hashimoto, et al., "Effects of strained layer structures on the threshold current density of AlgaInP/GaInP visible lasers," *Applied Physics Letters*, vol. 58, No. 9, Mar. 4, 1991, New York, US, pp. 879–880.

C. J. Chang-Hasnain, et al., "High performance 645nm InGaP/InGaAlP strained quantum well lasers," *Electronics Letters*, vol. 27, No. 17, Aug. 15, 1991, Stevenage, Herts, GB, pp. 1553–1555.

Y. Kan, et al., "Room temperature operation of three terminal quantum confined field effect light emitters," vol. 56, No. 21, May 21, 1990, *Applied Physics Letters*,- New York US, pp. 2059–2061.

*Primary Examiner*—William Mintel
*Attorney, Agent, or Firm*—Sol L. Goldstein

[57] ABSTRACT

A semiconductor-insulator-semiconductor (SIS) structure diode device for providing fast optoelectronic switching with stimulated emission. The device includes a substrate which has a buffer layer disposed on top thereof. An n-type cladding layer is disposed on top of the buffer layer. An undoped i-region is disposed on top of the buffer layer. The i-region includes at least one quantum well disposed between two waveguide layers. A lightly doped p-type cladding layer is disposed on top of the i-region. A contact layer is further disposed on top of the p-type cladding layer. First and second contact terminals are included for providing a two-terminal device. The diode advantageously provides good lasing performance, significant negative differential resistance and strong light sensitivity. In an alternate embodiment, a third terminal is connected to the undoped i-region to thereby form a three terminal device.

23 Claims, 6 Drawing Sheets

QUANTUM WELL SWITCHING DEVICE WITH STIMULATED EMISSION CAPABILITIES

This is a continuation application Ser. No. 07/755,886, filed Sep. 6, 1991, now abandoned.

BACKGROUND OF THE INVENTION

1. Technical Field

This invention relates to a semiconductor-insulator-semiconductor (SIS) structure diode and, more particularly, to novel quantum well optoelectronic switching devices with stimulated emission capabilities.

2. Discussion

Microwave semiconductor devices are generally used for generation, amplification, detection and control of high frequency electromagnetic energy. However, the usefulness of conventional semiconductor devices at relatively high frequencies is severely limited by high frequency effects. The use of III-V compound semiconductors such as gallium arsenide (GaAs) or indium phosphate (InP) rather than silicon has provided a tremendous improvement because the mobilities of electrons of these materials are several times as high as silicon which leads to lower series resistance.

Various optoelectronic switching devices exhibiting stimulated emission have been developed. Such devices have become attractive due to their potential applications in microwave generation, high speed logic switches, optical interconnects for integrated circuits, optical computing systems and optoelectronic integrated circuits (OEICs). Double barrier resonant tunneling diodes have been integrated monolithically with a quantum well (QW) laser to form an optical bistable device. Double heterostructure optoelectronic switching (DOES) devices incorporated with a single quantum well laser and vertical-to-surface transmission electrophotonic (VSTEP) devices have also been demonstrated as lasers to achieve stimulated emissions. However, due to the presence of the pn junction, the efficiency and the power of these devices have been found to be limited. In addition, most of the optoelectronic switching device structures are not compatible with OEICs, and thus cannot be easily integrated into OEICs.

Thus, it would be desirable to have an optoelectronic switching device which has a potential for faster optoelectronic switching. In addition, it is desirable to have such a device which exhibits a good lasing performance, significant negative differential resistance and a strong light sensitivity. Furthermore, it is desirable to have such a device which is compatible with state-of-the-art OEICs.

SUMMARY OF THE INVENTION

In accordance with the teachings of the present invention, a SIS structure diode is provided. The diode includes a substrate which has a buffer layer d posed on top thereof. An n-type cladding layer is disposed on top of the buffer layer. An undoped i-region is disposed on top of the buffer layer. The i-region includes at least one quantum well disposed between two waveguide layers. A lightly doped p-type cladding layer is disposed on top of the i-region. A contact layer is further disposed on top of the p-type cladding layer.

BRIEF DESCRIPTION OF THE DRAWINGS

The various advantages of the present invention will become apparent to one skilled in the art by reading the following and by reference to the following drawings in which.

DETAILED DESCRIPTION OF THE PREFERRED EMBODIMENT

Figure 1:
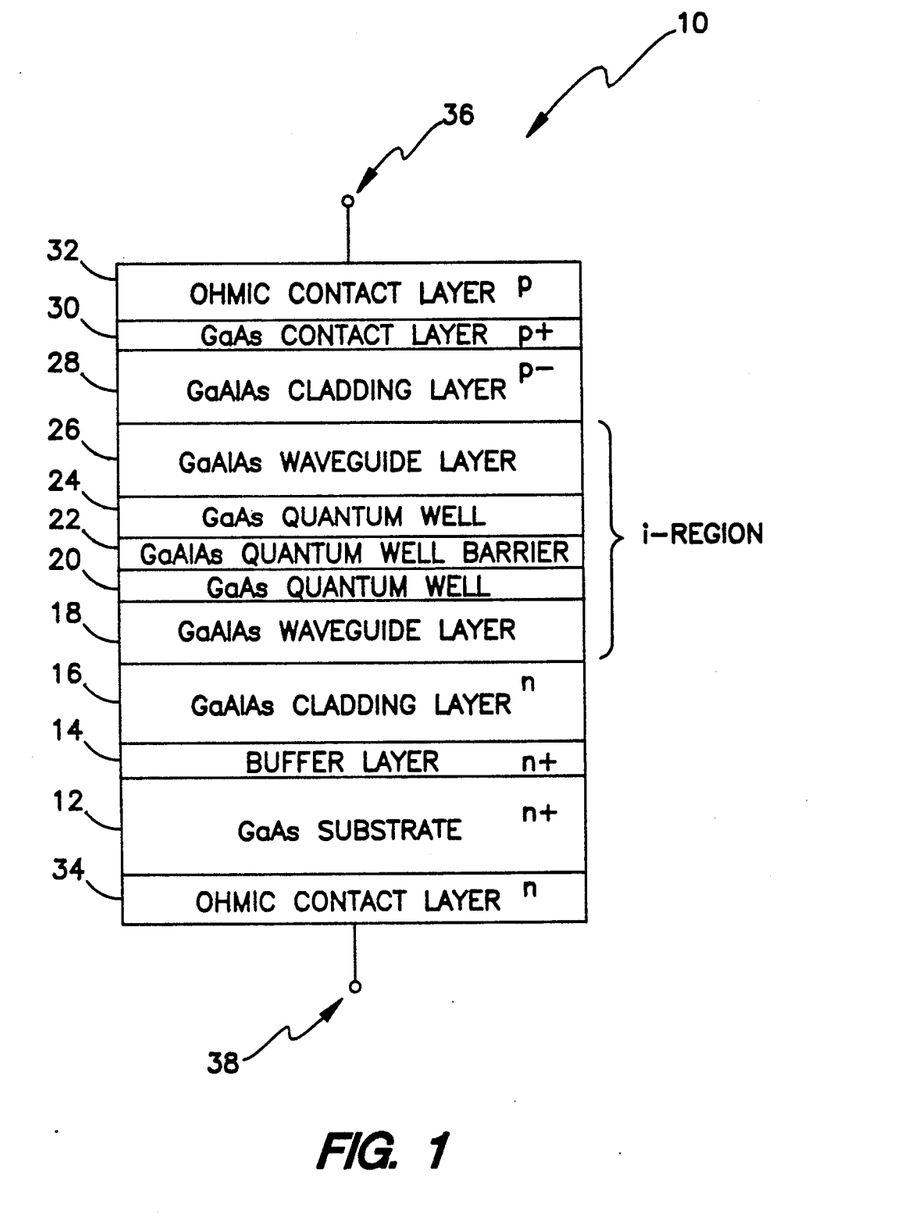
FIG. 1 is a diagrammatic cross-sectional view of a GaAs/GaAlAs SIS structure diode in accordance with the present invention.

Turning now to FIG. 1, a gallium arsenide (GaAs)-/gallium aluminum arsenide (GaAlAs) semiconductor-insulator-semiconductor SIS structure diode 10 having a plurality of fabricated layers is shown therein. The GaAs/GaAlAs SIS structure diode 10 is essentially an optoelectronic switching device which exhibits an s-type negative differential resistance at room temperature and emits a high performance stimulated emission. The device may be a two terminal structure device 10 or may be further constructed as a three terminal device. The device can be switched optically and/or electrically to produce an optical or electrical output. The device structure is similar to conventional separate confinement heterojunction quantum well lasers and is therefore easily integrated with optoelectronic integrated circuits. The semiconductor-insulator-semiconductor SIS structure diode 10 is a semiconductor structure which has an intrinsic layer sandwiched between two doped semiconductor layers in which the intrinsic layer can act as an insulator.

The GaAs/GaAlAs SIS structure diode 10 includes a substrate 12. The substrate 12 includes heavily doped n+ GaAs. An n+-type GaAs buffer layer 14 is disposed on top of the substrate 12. The buffer layer 14 is approximately 1.0 micrometer thick and includes a $6 \times 10^{18}$ cm$^{-3}$ Se concentration doping. The buffer layer 14 essentially smooths the substrate layer 12. A GaAlAs n-type cladding layer 16 is disposed on top of the buffer layer 14. The n-type cladding layer 16 is made of $Ga_{0.6}Al_{0.4}As$ and is approximately 1.2 micrometers thick with a $4 \times 10^{18}$ cm$^{-3}$ Se concentration doping.

An undoped i-region is located on top of the cladding layer 16. The i-region includes a first waveguide layer 18 made of undoped $Ga_{0.8}Al_{0.2}As$. The first waveguide layer 18 provides guidance for stimulated emission and is approximately 700 angstroms thick. A first undoped GaAs quantum well 20 is disposed on top of the first waveguide layer 18. The first quantum well 20 is approximately 70 angstroms thick. A GaAlAs quantum well barrier layer 22 is disposed on top of the quantum well 20. The quantum well barrier layer 22 is approximately 90 angstroms thick. A second GaAs quantum well 24 is disposed on top of the quantum well barrier layer 22. The second quantum well 24 is approximately 70 angstroms thick. A second waveguide layer 26 made of undoped Ga$_{0.8}$Al$_{0.2}$As is further disposed on top of the second quantum well 24. The second waveguide layer 26 is approximately 700 angstroms thick, and likewise provides guidance for stimulated emission.

The i-region shown in FIG. 1 includes first and second quantum well layers 20 and 24 separated by a quantum well barrier layer 22. For purposes of this invention, it is only required that the i-region contain at least one quantum well layer. If only one quantum well is provided, then a quantum well barrier layer is not necessary. However, if more than one quantum well layer is included, it is necessary that the quantum well layers be separated by quantum well barrier layers.

Located on top of the i-region is a p$^-$-type GaAlAs cladding layer 28 made of Ga$_{0.6}$Al$_{0.4}$As. The p$^-$-type cladding layer 28 is lightly doped with a $5 \times 10^{15}$–$10^{16}$ cm$^{-3}$ Zn concentration doping. The p$^-$-type cladding layer 28 is approximately 1.2 micro-meters thick. The p$^-$-type cladding layer 28 confines the stimulated emission and establishes a barrier for holes so that holes cannot recombine with electrons under low bias conditions.

A p$^+$-type GaAs contact layer 30 is disposed on top of the p$^-$-type cladding layer 28. The p-type contact layer 30 is approximately 0.5 micrometers thick and is heavily doped with Zn to ensure a good tunneling ohmic junction with the ohmic contact. A p-type ohmic contact layer 32 is disposed on top of the contact layer 30 having a p-type contact terminal 36 for allowing contact to external devices. The p-type ohmic contact layer 32 includes conductive material such as Ti-Pt-Au. Alternatively, the p$^+$-type contact layer 30 and p-type ohmic contact layer 32 may be replaced with n$^+$-type contact and ohmic contact layers. Likewise, an n-type ohmic contact layer 34 having an n-type contact terminal 38 is disposed on the bottom of the structure diode 10 for purposes of providing contact to external devices. The n-type ohmic contact layer 34 includes conductive material such as Ni-AuGe-Ni-Au.

The resulting diode structure 10, in general, is a four layer n$^+$-i-p$^-$-p$^+$ structured device which is similar to a conventional separate confinement heterojunction quantum well structure in that it may be integrated with present OEICs. The n$^+$-i-p$^-$ structure is a semiconductor-insulator-semiconductor (SIS) type capacitor which behaves similar to a metal-insulator-semiconductor (MIS) type capacitor. The p$^-$-p$^+$ structure is a GaAs/GaAlAs heterojunction. Therefore, the diode structure device 10 includes two junctions which are a SIS and a p$^-$-p$^+$ GaAs/GaAlAs heterjunction capacitor. The diode structure device 10 may be fabricated by standard techniques known in the art, such as wet chemical etching, reactive ion etching, ion beam etching and other dry etching techniques.

Figure 2:
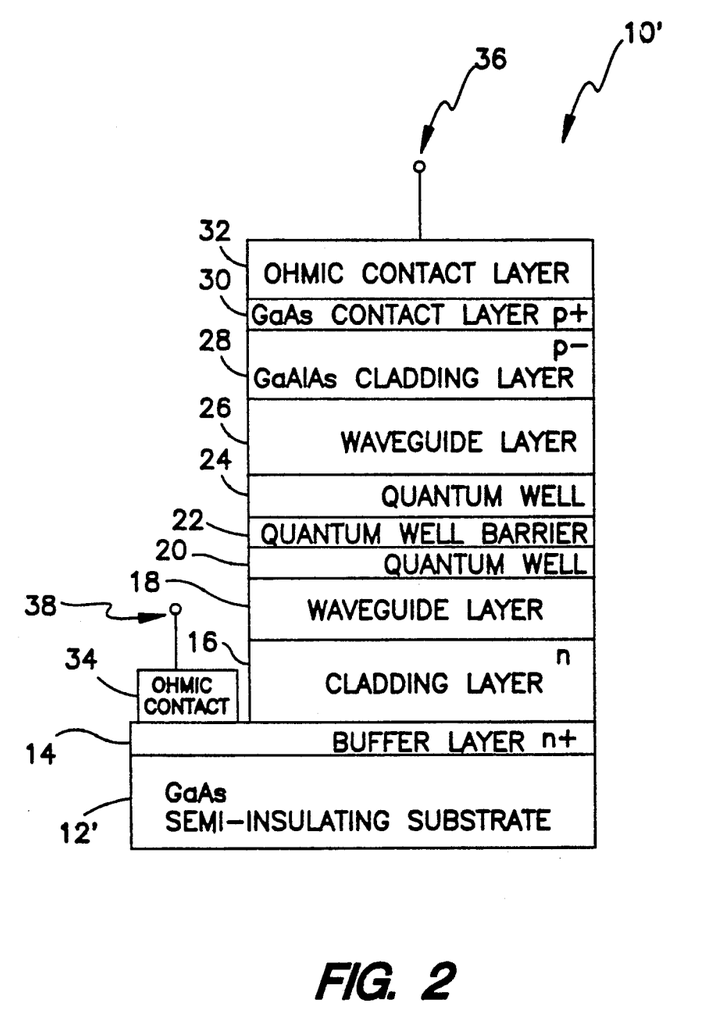
FIG. 2 is a diagrammatic cross-sectional view of a GaAs/GaAlAs SIS structure diode in accordance with an alternate embodiment of the present invention.

FIG. 2 illustrates a GaAs/GaAlAs SIS structure diode 10' in accordance with an alternate embodiment of the present invention. The structure diode 10' is fabricated or structured in the same manner as the diode structure 10 shown in FIG. 1 with the exception that the diode structure 10' includes a semi-insulating GaAs substrate 12' which is undoped. The semi-insulating GaAs substrate 12' advantageously reduces parasitic capacitance, provides for faster operation and therefore better performance. In addition, the n-type ohmic contact layer 34 is disposed on top of the buffer layer 14 and separate from the other layers of the device 10'.

Figure 3:
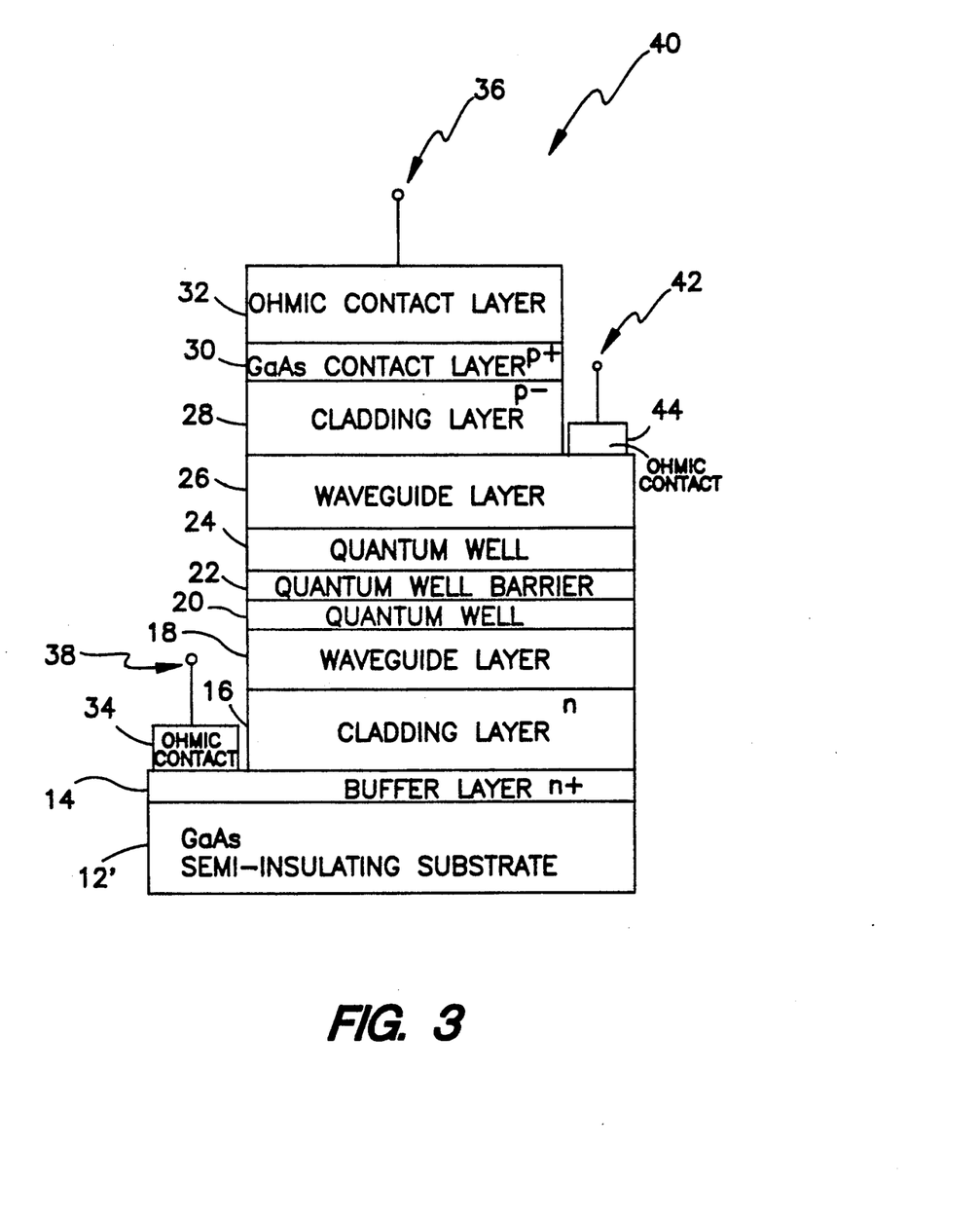
FIG. 3 is a diagrammatic cross-sectional view of a three terminal GaAs/GaAlAs SIS structure device in accordance with an alternate embodiment of the present invention.

FIG. 3 illustrates a three terminal device 40 in accordance with an alternate embodiment of the present invention. The three terminal device 40 is structured in a similar manner to the device 10' shown in FIG. 2 with the exception that a third contact is added to form a three terminal device known as a transistor. The additional third terminal 42 includes an Si ion implant inserted within the layers of the i-region. The third terminal 42 forms the gate for the transistor and is connected to the ion implant through the ohmic contact layer 44. The p-type contact layer terminal 36 forms the emitter terminal of the three terminal device 40. The n-type contact terminal 38 forms the n-type contact collector of the three terminal device 40.

As FIGS. 1 through 3 illustrate, an optoelectronic switching device with a stimulated emission is shown therein. The device may be configured as a two terminal device 10 structured as a diode. With the addition of a third terminal, the device may further be structured as a three terminal device 40 to form a transistor.

Figure 4A:
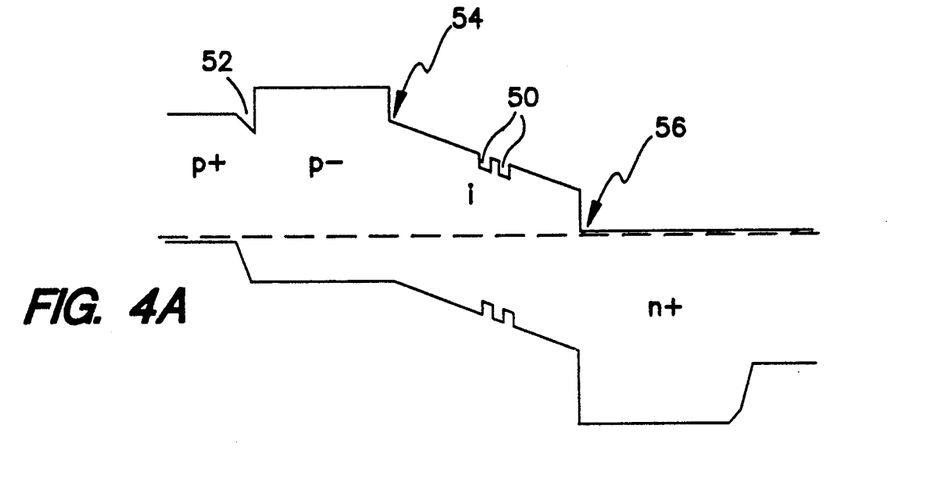
FIGS. 4A, 4B and 4C are energy band diagrams which illustrate the energy variation of the GaAs/GaAlAs SIS structure device in accordance with the present invention.
Figure 4B:
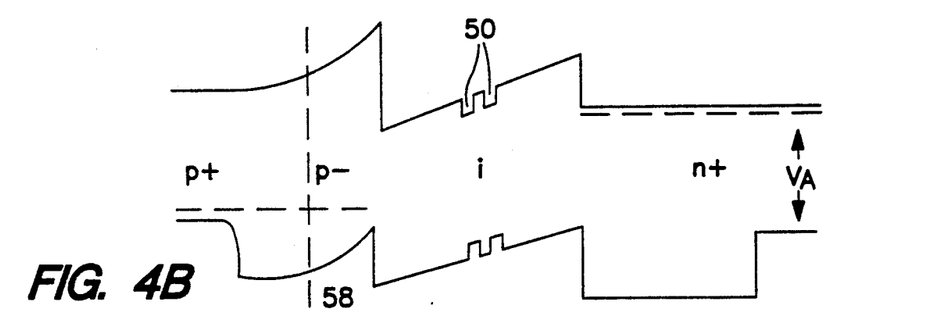
Figure 4C:
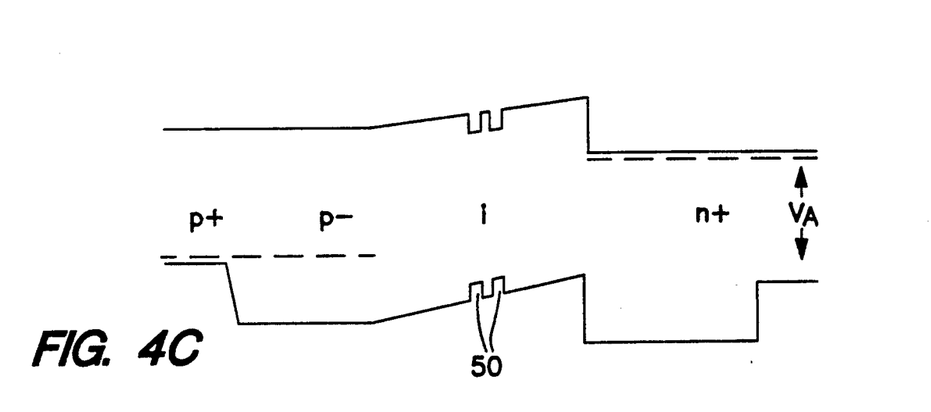

The switching mechanism of the device is illustrated by the energy band diagrams shown in FIGS. 4a through 4c. FIG. 4a illustrates the energy band diagram at thermal equilibrium. If the conductivity of the undoped i-region is greater than that of the reverse biased p$^+$ GaAs/p$^-$GaAlAs (p$^+$/p$^-$) junction 52, most of the applied voltage will be dropped across the p$^+$/p$^-$ junction 52. The current versus voltage (I-V) characteristic of the device under reverse bias thus behaves similar to a reverse biased pn junction.

FIG. 4b illustrates the results of applying a forward bias. When the forward bias increases, the free electrons are swept out of the p$^-$-region through the p$^+$/p$^-$ junction 52 and the depletion region 58 grows. Electron hole pairs are generated in the depletion region 58. This is because the electrons are swept out of the device through the p$^+$/p$^-$ junction 52 and the holes are swept to the p$^-$GaAlAs/undoped GaAlAs (p$^-$/i) interface 54. As a result, the generated holes accumulate at the (p$^-$/i) interface 54. Under these conditions, the holes cannot be injected through a wideband gap barrier into the undoped i-region. In addition, electrons are limited by tunneling through the barrier which results in a significant voltage drop and a large series resistance across the depletion region 58 and undoped i-regions. As a result, these regions thus absorb most of the potential and thereby provide current flow in addition to a high voltage, low current, off state.

When the forward bias increases, the hole current flowing in the p$^+$/p$^-$ junction 52 increases together with the concentration of holes at the (p$^-$/i) interface 54. The concentration of holes increases as a result of the thermal and/or light generation of electron hole pairs in the depletion region 58. It may be also be caused by punching through the p$^+$/p$^-$ junction 52, avalanching in the P$^-$ layer, and/or the incipient electron tunneling current from the n+/i junction 56. The increase in the hole concentration and the hole current leads to an increase in the electron current through the n-type GaAlAs/undoped GaAlAs (n+/i) junction 56. This increased electron current feedbacks into the p$^+$/p$^-$ junction 52 and increases the electron and hole currents flowing through the p$^+$/p$^-$ junction 52. When the hole current flowing through the p+/p− junction 52 is larger than the generation current in the depletion region 58, the internal current loop gain will be in excess of the unity. The feedback of the current loop thus becomes positive and gives rise to regenerative switching. As a consequence of the regeneration process, the device displays an s-type negative differential resistance (NDR) such that the voltage collapsed and the current increases. In this situation, both the p+/p− junction 52 and the n+/i junction 56 are strongly forward biased as shown in FIG. 4c.

Immediately after the voltage collapses, the rapidly increased electron and hole currents are injected into the quantum wells 50 of the i-region wherein they recombine and give rise to a spontaneous and/or stimulated emission. This recombination process reduces the internal current gain to less than 1 and the device reaches a stable state.

For electric fields larger than $10^4$ V/cm, the hole gas will be heated and thermionic or ballastic emission over the barrier can occur. However, because the quantum wells have the minimum potential in the i-region, the hot holes will be injected into the quantum wells instead of being swept out of the high field region and will further recombine in the n-type GaAlAs cladding layer. This injection mechanism prevents impact ionization due to high fields. Moreover, since electrons and holes recombine in the quantum wells, with the proper wave guiding provided by the cladding layers, stimulated emission can occur.

Figure 5:
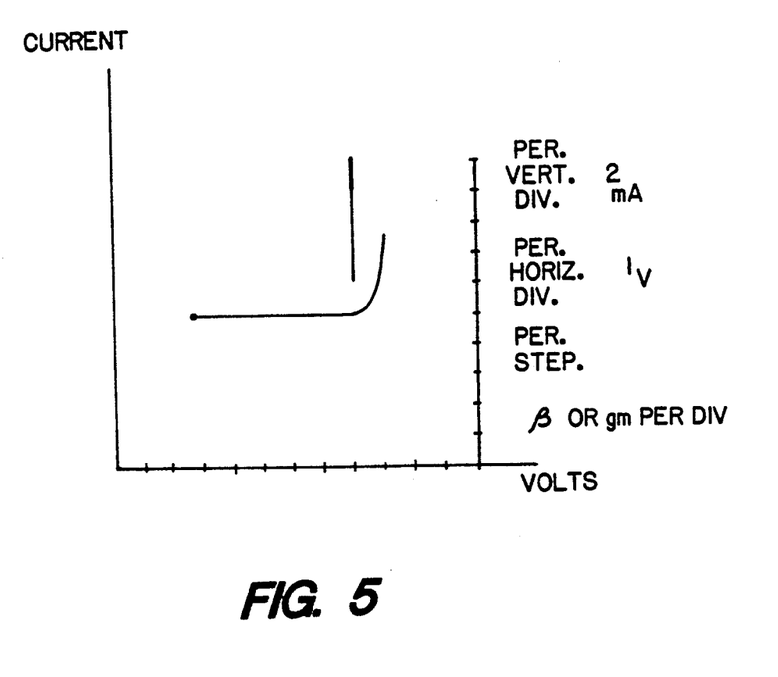
FIG. 5 is a photograph which illustrates the current versus voltage characteristics of the GaAs/GaAlAs SIS structure device in accordance with the present invention.

FIG. 5 illustrates the current versus voltage (I-V) characteristic of the device at room temperature. Because the QWs have the minimum potential in the i-region, the hot holes will be injected into the QWs instead of being swept out of the high field region and they will recombine in the n-GaAlAs. Since electrons and holes recombine in the QWs, with the proper waveguiding provided by cladding layers, stimulated emission can occur.

Figure 6:
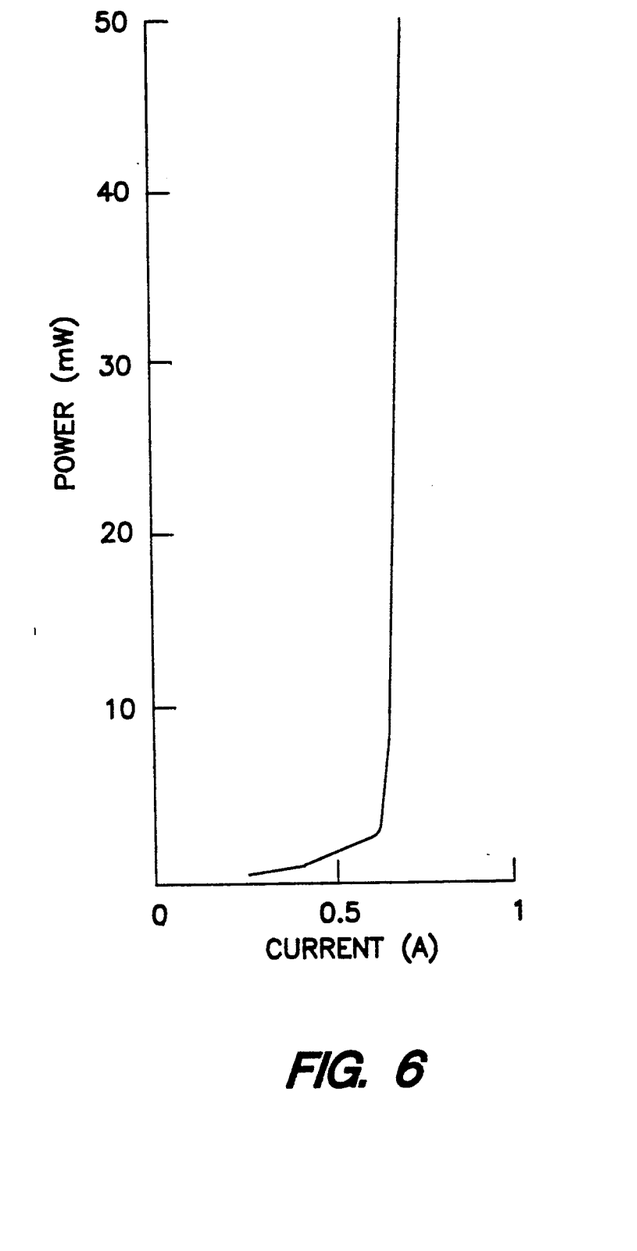
FIG. 6 is a graph which illustrates the output power versus current of the GaAs/GaAlAs SIS structure device in accordance with the present invention.

FIG. 6 illustrates the output power versus current of the device. Threshold current of 600 milliamps, differential quantum efficiency as high as 67% and power in excess of 50 milliwatts per facet are obtainable under quasi-continuous wave conditions. This provides superb overall performance in terms of power, differential quantum efficiency and threshold current density for the optoelectronic switching devices exhibiting stimulated emission. The power in the device measured for FIG. 3 was kept lower than 50 milliwats per facet. However, the device is capable of providing more improved threshold current density, differential quantum efficiency and output power when fully optimized.

The switching device described herein results in either a two or three terminal device. The device advantageously provides fast optoelectronic switching and exhibits a stimulated emission.

In view of the foregoing, it can be appreciated that the present invention enables the user to achieve an optoelectronic switching device having a diode structure with stimulated emissions. Thus, while this invention has been disclosed herein in connection with a particular example thereof, no limitation is intended thereby except as defined by the following claims. This is because the skilled practitioner will recognize that other modifications can be made without departing from the spirit of this invention after studying the specification and drawings.

What is claimed is:

1. A semiconductor diode device having optoelectronic switching capabilities, said device comprising:
    a substrate;
    an n-type cladding layer disposed on top of said substrate;
    an undoped i-region having at least one quantum well disposed on top of said n-type cladding layer;
    a p-type cladding layer disposed on top of said i-region, said n-type layer, undoped i-region and p-type layer forming a p-i-n junction; and
    a contact layer disposed on top of said p-type cladding layer, said p-type and contact layers having characteristics which form a heterojunction that provides a barrier for holes, wherein said p-i-n junction and said heterojunction exhibit negative differential resistance and provide for stimulated emission and optoelectronic switching capabilities.

2. The device as defined in claim 1 wherein said i-region further comprises:
    a first waveguide layer located below said quantum well; and
    a second waveguide layer disposed on top of said quantum well.

3. The device as defined in claim 2 wherein said i-region includes a plurality of quantum wells having barrier layers located therebetween.

4. The device as defined in claim 1 further comprising:
    a first ohmic contact layer disposed on top of said contact layer; and
    a second ohmic contact layer connected to said substrate.

5. The device as defined in claim 4 further comprising:
    a first contact terminal connected to said first ohmic contact layer; and
    a second contact terminal connected to said second ohmic contact layer.

6. The device as defined in claim 5 wherein said device further includes a third ohmic contact layer implanted within the i-region, said third ohmic contact layer having a third contact terminal connected thereto.

7. The device as defined in claim 1 further comprising:
    a buffer layer disposed between said substrate and said n-type cladding layer.

8. The device as defined in claim 7 wherein said substrate and buffer layer include gallium arsenide (GaAs).

9. The device as defined in claim 1 wherein said p-type and n-type cladding layers include gallium aluminum arsenide (GaAlAs) and said p-type cladding layer has a p− doping.

10. The device as defined in claim 1 wherein said contact layer includes p+-type gallium arsenide (GaAs).

11. A three terminal semiconductor device comprising:
    a substrate;
    an n-type cladding layer disposed above said substrate;
    an undoped i-region having at least one quantum well disposed on top of said n-type cladding layer;
    a p−-type cladding layer disposed on top of said i-region;
    a p+-type contact layer disposed on top of said p−-type cladding layer;

a first ohmic contact layer disposed on top of said p+-type contact layer and having a first contact terminal connected thereto;

a second ohmic contact layer connected to said substrate and having a second contact terminal connected thereto; and a third ohmic contact layer implanted within said i-region, said third ohmic contact layer having a third contact terminal connected thereto.

12. The device as defined in claim 11 wherein said device further comprises a buffer layer disposed on top of said substrate and below said n-type cladding layer.

13. The device as defined in claim 11 wherein said i-region further comprises:

a first waveguide layer located below said quantum well; and a second waveguide layer disposed on top of said quantum well.

14. A semiconductor diode device with switching capabilities, said device comprising:

a substrate;

an n-type layer disposed above said substrate;

an undoped i-region having at least one quantum well disposed on top of said n-type layer;

a p-type layer disposed on top of said i-region, said n-type layer, undoped i-region and p-type layer forming a p-i-n junction; and a contact layer disposed on top of said p-type layer, said contact and p-type layers having characteristics sufficient to form a heterojunction so that said device exhibits negative differential resistance and provides for switching capabilities.

15. The device as defined in claim 14 wherein:

said p-type layer includes $p^-$-type gallium aluminum arsenide (GaAlAs);

said contact layer includes gallium arsenide (GaAs); and said heterojunction providing a barrier for holes.

16. The device as defined in claim 14 wherein said i-region further comprises:

a first waveguide layer located below said quantum well; and a second waveguide layer disposed on top of said quantum well.

17. An optoelectronic switching device comprising:

input means for receiving a signal;

means for providing a depletion region that forms a barrier when the signal is below a first given voltage;

semiconductor junction means including a p-i-n junction operatively coupled to a semiconductor heterojunction for generating a regeneration process when the signal is above a second given voltage, wherein said regeneration process provides a negative differential resistance; and means for providing an emission when the signal is above a given current.

18. The device as defined in claim 17 wherein said device further comprises:

a $p^-$-type region having gallium arsenide (GaAlAs) for providing said depletion region;

an undoped i-region for providing said emission, said i-region being connected to said $p^-$-type region and having at least one quantum well, wherein said $p^-$-type region and i-region form a $p^-/i$ junction; and a $p^+$-type region having gallium arsenide (GaAs) connected to said $p^-$-type region for forming a $p^+/p^-$ heterojunction, wherein said $p^+/p^-$ heterojunction and said $p^-/i$ junction provide for said regeneration process.

19. The device as defined in claim 18 wherein said i-region further comprises:

a first waveguide layer located below said quantum well; and a second waveguide layer disposed on top of said quantum well;

wherein said i-region is disposed between an n-type GaAlAs cladding layer and a $p^-$-type GaAlAs cladding layer, said optoelectronic switching device thereby providing for a stimulated emission.

20. The device as defined in claim 18 wherein said depletion region allows holes to accumulate therein for low bias, said depletion region collapsing for increased bias whereby said holes combine with electrons in said quantum well and begin to lase therein.

21. The device as defined in claim 17 wherein said signal is an optical signal.

22. The device as defined in claim 17 wherein said signal is an electrical signal.

23. A semiconductor switching diode device comprising:

a p-i-n junction; and a semiconductor heterojunction providing a barrier for holes and operatively connected to said p-i-n junction, wherein said p-i-n junction and said heterojunction operate so as to exhibit negative differential resistance and provide optoelectronic switching capabilities.

* * * * *

UNITED STATES PATENT AND TRADEMARK OFFICE
CERTIFICATE OF CORRECTION

PATENT NO. : 5,298,762
DATED : March 29, 1994
INVENTOR(S) : Simon S. Ou

It is certified that error appears in the above-indentified patent and that said Letters Patent is hereby corrected as shown below:

On the title page, item [21] should read 952,009

Signed and Sealed this

Fifteenth Day of November, 1994

Attest:

BRUCE LEHMAN

*Attesting Officer*   *Commissioner of Patents and Trademarks*